United States Patent
Sze et al.

(10) Patent No.: US 7,564,083 B2
(45) Date of Patent: Jul. 21, 2009

(54) ACTIVE PIXEL SENSOR

(75) Inventors: Jhy-Jyi Sze, Tai-Nan (TW); Junbo Chen, Tai-Chung Hsien (TW); Ming-Yi Wang, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 149 days.

(21) Appl. No.: 10/906,581

(22) Filed: Feb. 25, 2005

(65) Prior Publication Data

US 2006/0192261 A1 Aug. 31, 2006

(51) Int. Cl.
*H01L 31/062* (2006.01)
(52) U.S. Cl. ............................. 257/292; 257/E27.131; 438/81
(58) Field of Classification Search ......... 257/222–224, 257/229–234, 243, 257, 258, 431, 290–292, 257/446, 448, 461, 466, E27.13, E27.131, 257/E27.133, 345, 372, 394, 398, 349, 544; 438/73, 80, 81
See application file for complete search history.

(56) References Cited

U.S. PATENT DOCUMENTS

| | | | | |
|---|---|---|---|---|
| 4,025,364 A | * | 5/1977 | Smith | 438/330 |
| 5,859,450 A | * | 1/1999 | Clark et al. | 257/233 |
| 5,981,320 A | * | 11/1999 | Lee | 438/199 |
| 6,597,025 B2 | * | 7/2003 | Lauter et al. | 257/258 |
| 6,724,060 B2 | * | 4/2004 | Maeda | 257/431 |
| 2002/0109187 A1 | * | 8/2002 | Matsumoto et al. | 257/347 |
| 2002/0140045 A1 | * | 10/2002 | Lauter et al. | 257/431 |
| 2002/0149078 A1 | * | 10/2002 | Hynecek | 257/461 |
| 2005/0269604 A1 | * | 12/2005 | Koizumi et al. | 257/291 |
| 2006/0132633 A1 | * | 6/2006 | Nam et al. | 348/308 |

* cited by examiner

*Primary Examiner*—Lex Malsawma
*Assistant Examiner*—William F Kraig
(74) *Attorney, Agent, or Firm*—Winston Hsu

(57) ABSTRACT

An active pixel sensor is proposed by the invention. The position of the gate of the reset transistor is kept away from the interface of the isolation region and the silicon so that the depletion region does not reach the isolation. Accordingly, dark currents caused by isolation region damages can be avoided.

23 Claims, 6 Drawing Sheets

ACTIVE PIXEL SENSOR

BACKGROUND OF INVENTION

1. Field of the Invention

The invention relates to an active pixel sensor (APS), and more particularly, to an APS which has complementary metal-oxide semiconductor (CMOS) elements.

2. Description of the Prior Art

An APS is a common solid-state image sensor. Since an APS comprises CMOS elements, it is also called a CMOS image sensor. The APS is produced by using conventional semiconductor techniques. The CMOS image sensor has advantages of low cost and reduced device size and due to these factors, CMOS image sensor devices tend to replace charge-coupled devices (CCD). In addition, the CMOS image sensor has advantages of high quantum efficiency and low read-out noise. The CMOS image is therefore commonly used in photoelectric products, such as PC cameras and digital cameras.

A typical APS comprises a photodiode for sensing light, and three metal-oxide semiconductor (MOS) transistors including a reset transistor, a source-follower transistor serving as a current source follower, and a row-select transistor serving as a row selector. The light current in the photo sensor of the photodiode induced by light represents a signal, whereas the dark current present in the device in the absence of light represents noise. The photodiode processes signal data by using the value of the signal-to-noise ratio (S/N ratio).

Please refer to FIG. 1, which is a schematic diagram of an APS cell 10 according to the prior art. The APS cell 10 comprises a photodiode 12, a reset transistor 14, a source-follower transistor 16, and a row-selector transistor 18, wherein one of the sources/drains of the reset transistor 14 is electrically connected to the photodiode 12 and the gate of the source-follower transistor 16. In typical operation, the reset transistor 14 is turned off or turned on to reset the voltage of the photodiode 12 for counting the S/N ratio of corresponding time to process the image data.

Please refer to FIG. 2. FIG. 2 is a top view of the circuit layout of the APS cell 10 shown in FIG. 1. To simplify the diagram, the row-selector transistor 18 is not shown in FIG. 2. As shown in FIG. 2, the two regions next to the gates 14a and 16a of the reset transistor 14 and the source-follower transistor 16 are N+ doped regions 20, which serve as a source/drain of the transistors. Similarly, the photodiode 12 of the APS cell 10 also contains an N+ doped region 20 positioned in a P-well or a P-substrate (not shown). The conductive structure 22 is used for electrically connecting the gate 16a and the photodiode 12, and the conductive structure 24 is used for electrically connecting the gate 14a and a reset voltage $V_{reset}$, while the conductive structure 26 is used for electrically connecting the doped region 20 and a circuit operating voltage ($V_{dd}$). In addition, the APS cell 10 is encompassed by an isolation region 28, so that all elements of the APS cell 10 are isolated. The isolation region 28 is a field oxide layer (FOX) or a shallow trench isolation (STI).

According to the prior art method of forming the doped region of the APS cell 10, an ion implantation process is performed to form an N-type doped region 20 on the surface of the P-well or the P-substrate. Taking the P-well as an example, arsenic (As), with an energy of about 80 KeV and a dosage of about $10^{15}$ ion/cm$^2$, is used as a major dopant in the ion implantation process. A depletion region for detecting the leakage current is consequently formed along the PN junction between the doped region 20 and the adjacent P-type well, which plays the role of the photo sensor region of the photodiode 12. However, the depletion region contacts the isolation region 28 in the conventional structure, as marked by the dotted circles, causing the depletion region to generate current, which is counted as a part of dark current. Moreover, any damage of the isolation region 28 will induce a greater amount of leakage, i.e. dark current. Thus, the S/N ratio will be reduced and the performance of the APS cell 10 is seriously influenced.

In order to improve the conventional structure, the manufacturers designed another APS cell structure with high S/N ratio by placing a guard ring encompassing the photo sensor region of the photodiode for reducing the dark current so as to improve the accuracy of the S/N ratio and the performance of the photodiode.

Please refer to FIG. 3. FIG. 3 is a top view of an APS cell with high S/N ratio according to the prior art. For convenience, the reference numerals used are the same as those used in FIG. 2. As shown in FIG. 3, the photo sensor region of the photodiode 12 is formed with a portion of the N+ doped region 20, which is encompassed by a guard ring 30. The fabrication process of the guard ring 30 is to perform a P-type ion implantation process surrounding the N+ doped region 20 so as to form a junction P-guard ring 30. However, for increasing the width of the semiconductor channel of the reset transistor 14, the gate 14a has to extend into the isolation region 28, causing the active region underneath the gate 14a to become depleted and contact the isolation region 28, as shown in the dotted circle in FIG. 3. Under this situation, leakage current is also generated and is taken as dark current by the photodiode 12, which influences the accuracy of the performance of the APS cell 10.

Therefore, there is still a need to improve the structure of the APS cell to separate the depletion region from high stress and high defect density regions (such as the isolation region), so as to improve the photo sensing performance of the APS cell.

SUMMARY OF INVENTION

It is therefore a primary objective of the claimed invention to provide an APS in which the depletion region does not contact the isolation region so as to solve the above-mentioned problem.

According to the claimed invention, the APS cell comprises an isolation region, a photodiode, a guard ring, a first transistor, and a second transistor. The isolation region is positioned in a semiconductor substrate, encompassing and isolating the APS cell, wherein the isolation region has an isolation interface with other elements of the APS cell. The photodiode is positioned in the semiconductor substrate and comprises a first doped region serving as a photo sensor region. The guard ring encompasses the first doped region of the photodiode and has a gap. In addition, the guard ring is positioned at the isolation interface surrounding the first doped region. The first transistor has a first gate electrically connected to the first doped region and has a common drain with the second transistor. The second transistor comprises a source electrically connected to the first doped region and a second gate positioned on the semiconductor substrate in the gap of the guard ring without overlapping the isolation interface.

It is an advantage of the claimed invention that the guard ring is disposed along with the isolation interface of the isolation region and other elements of the APS cell, such as the first doped region, and the second gate is positioned next to the guard ring, so that the second gate is not disposed at the isolation interface. This ensures the depletion region in the semiconductor substrate underneath the second gate does not contact the isolation region, and therefore avoids generation of leakage current and lowering of the S/N ratio. Accordingly, the performance of the APS cell can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
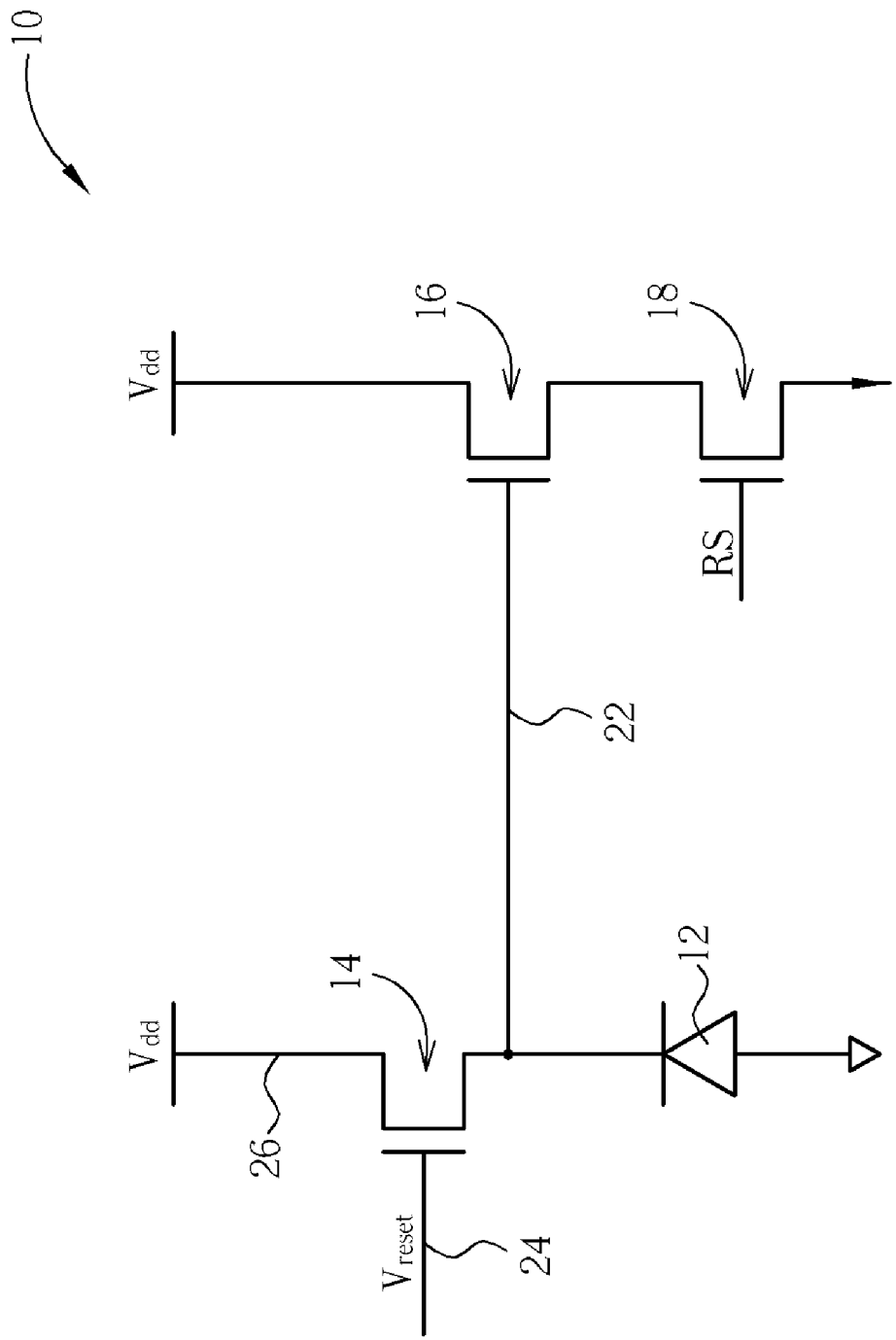
FIG. 1 is a schematic diagram of an APS cell according to the prior art.
Figure 2:
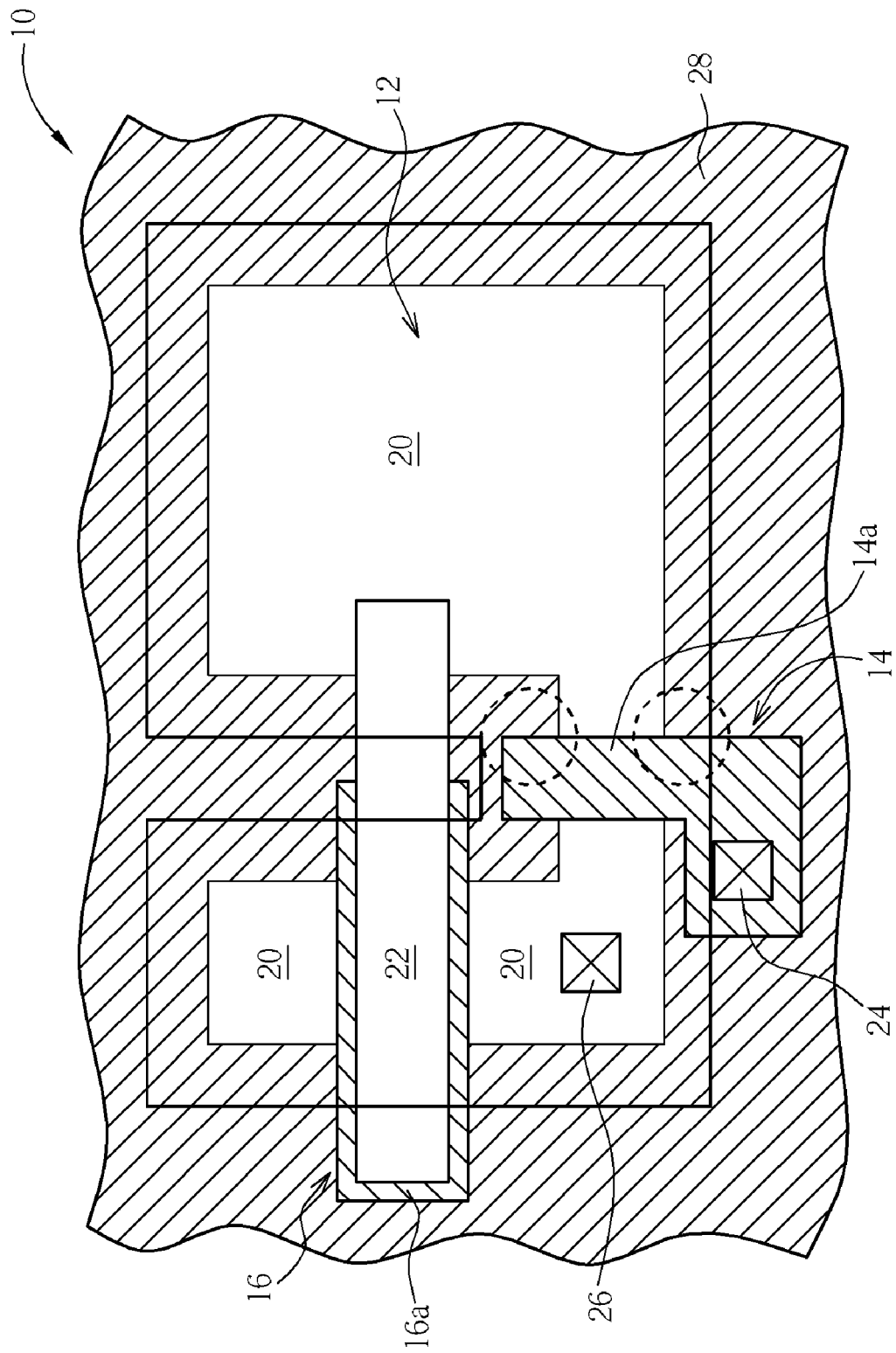
FIG. 2 is a top view of the circuit layout of the APS cell shown in FIG. 1.
Figure 3:
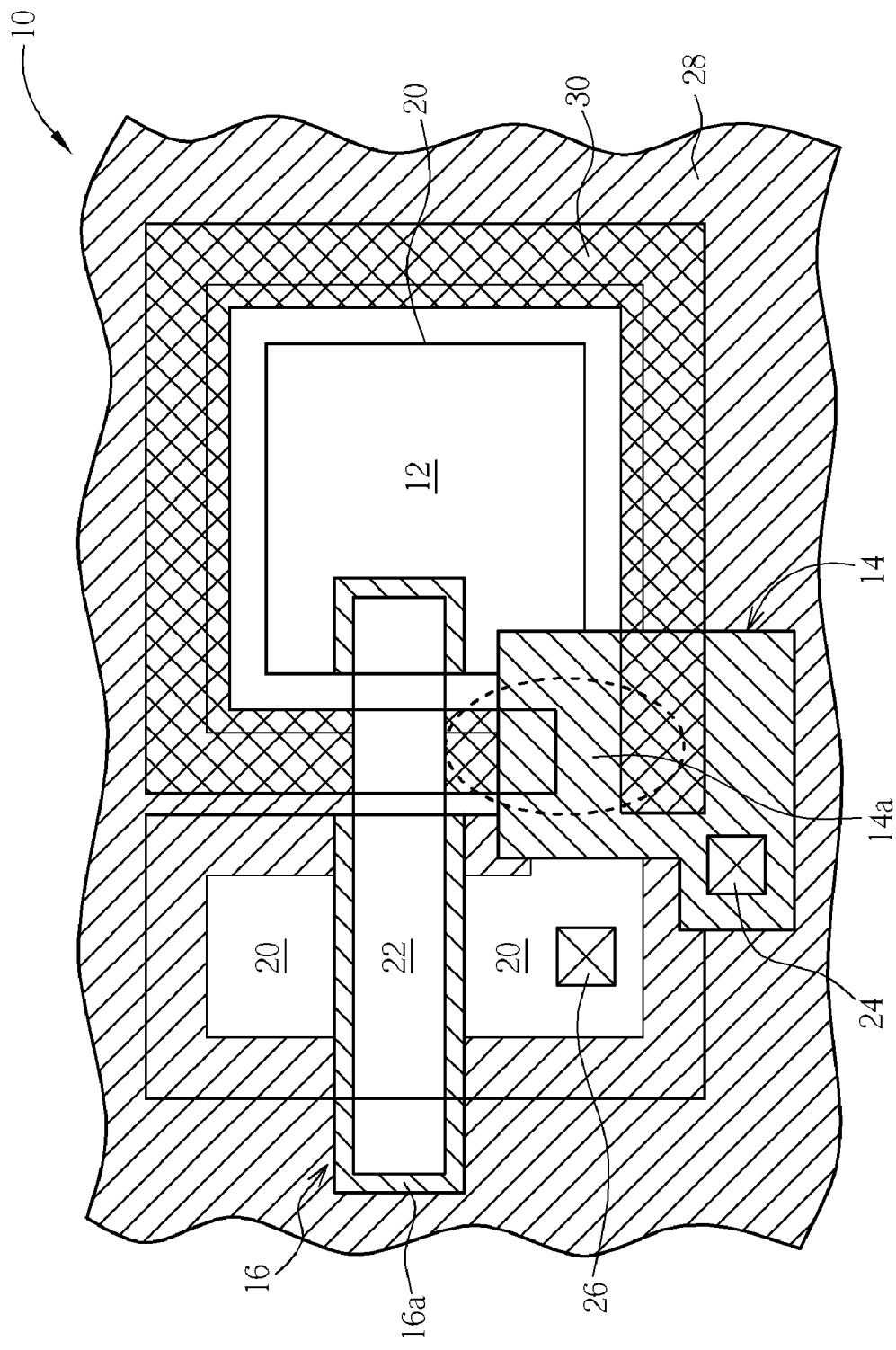
FIG. 3 is a top view of an APS cell with high S/N ratio according to the prior art.
Figure 4:
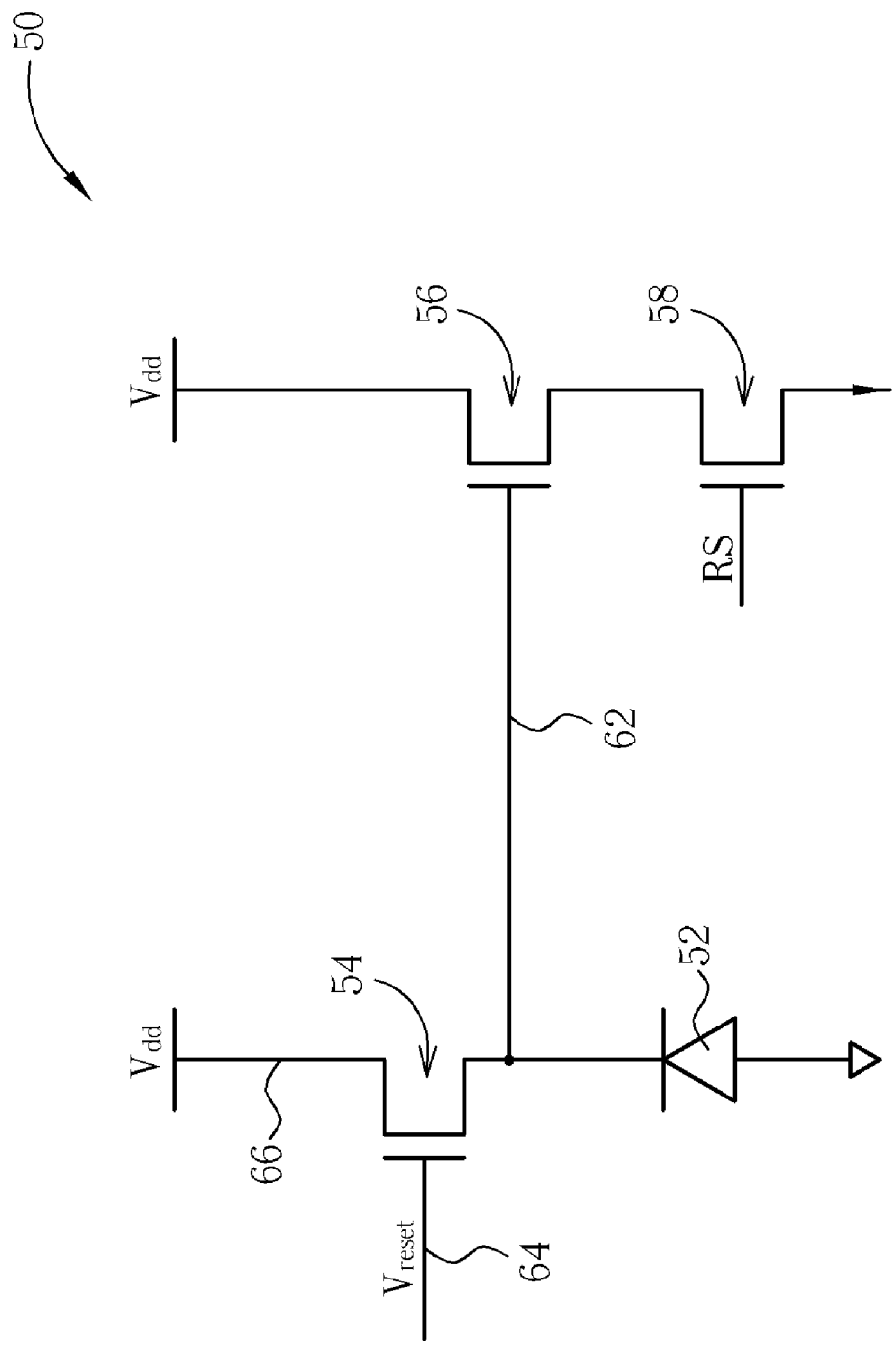
FIG. 4 is a schematic diagram of an APS cell according to the present invention.
Figure 5:
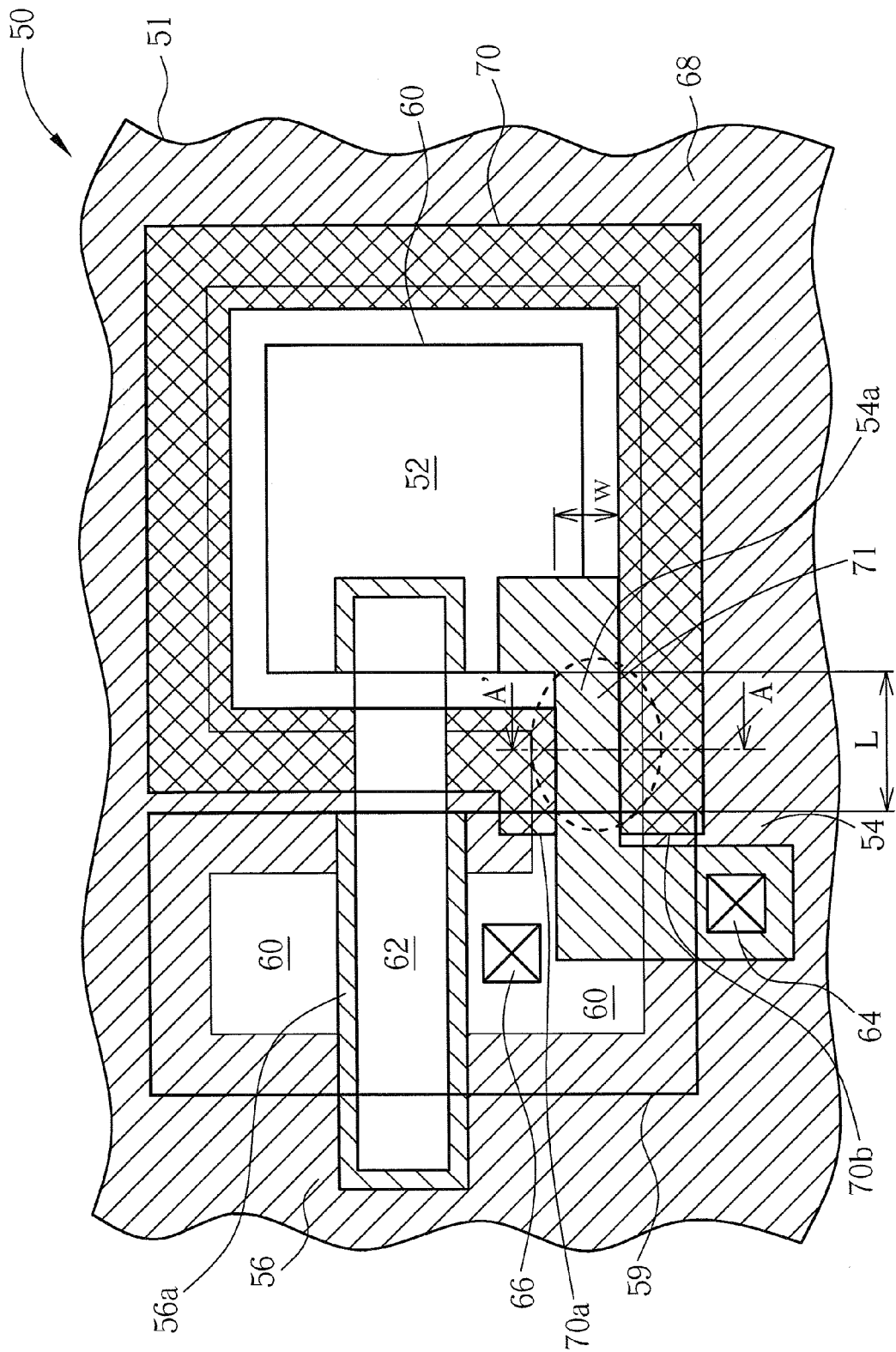
FIG. 5 is a top view of the circuit layout of the APS cell shown in FIG. 4.

The present APS comprises a plurality of APS cells arranged in array. Please refer to FIGS. 4 and 5. FIG. 4 is a schematic diagram of an APS cell 50 according to the present invention, and FIG. 5 is a top view of the circuit layout of the APS cell 50 shown in FIG. 4. The APS cell 50 comprises a photodiode 52, and three CMOS transistors, the reset transistor 54, the source-follower transistor 56, and the row-selector transistor 58 (not shown in FIG. 5 for simplifying the diagram). The photodiode 52 is positioned in a semiconductor substrate, wherein the semiconductor substrate is a silicon substrate in a preferable embodiment of the present invention. The reset transistor 54 has a source/drain electrically connected to the photodiode 52, and the other drain/source of the reset transistor 54 is common with the source-follower transistor 56, which is electrically connected to a current operating voltage $V_{dd}$ through a conductive structure 66. The gate 54a of the reset transistor 54 and the gate 56a of the source-follower transistor 56 are formed with doped polysilicon or other conductive material on the silicon substrate.

The conductive structure 64 is used for electrically connecting the gate 54a to a reset voltage $V_{reset}$, and the conductive structure 62 electrically connects the gate 56a and the photodiode 52. In addition, the sources and drains of the reset transistor 54 and the source-follower transistor 56, and the photo sensor region of the photodiode 52 are formed with N+ doped regions 60 positioned in a P-well or a P-substrate. In this embodiment, the N+ doped regions 60 are disposed in a P-well of the silicon substrate and formed through an ion implantation process.

Each APS cell 50 is isolated by the isolation region 68, wherein the isolation region 68 is a field oxide layer (FOX) or a shallow trench isolation (STI). Furthermore, in order to avoid dark current generated by the isolation region 68, a guard ring 70 is disposed surrounding the photodiode 52. In this embodiment, the guard ring 70 is fabricated through a P-type ion implantation to form a junction P-type doped region, a P-guard ring, at the isolation interface of the isolation region 68 and the silicon substrate, so that the depletion region of the photodiode 52 does not directly contact the isolation region 68 to raise the dark current.

Figure 6:
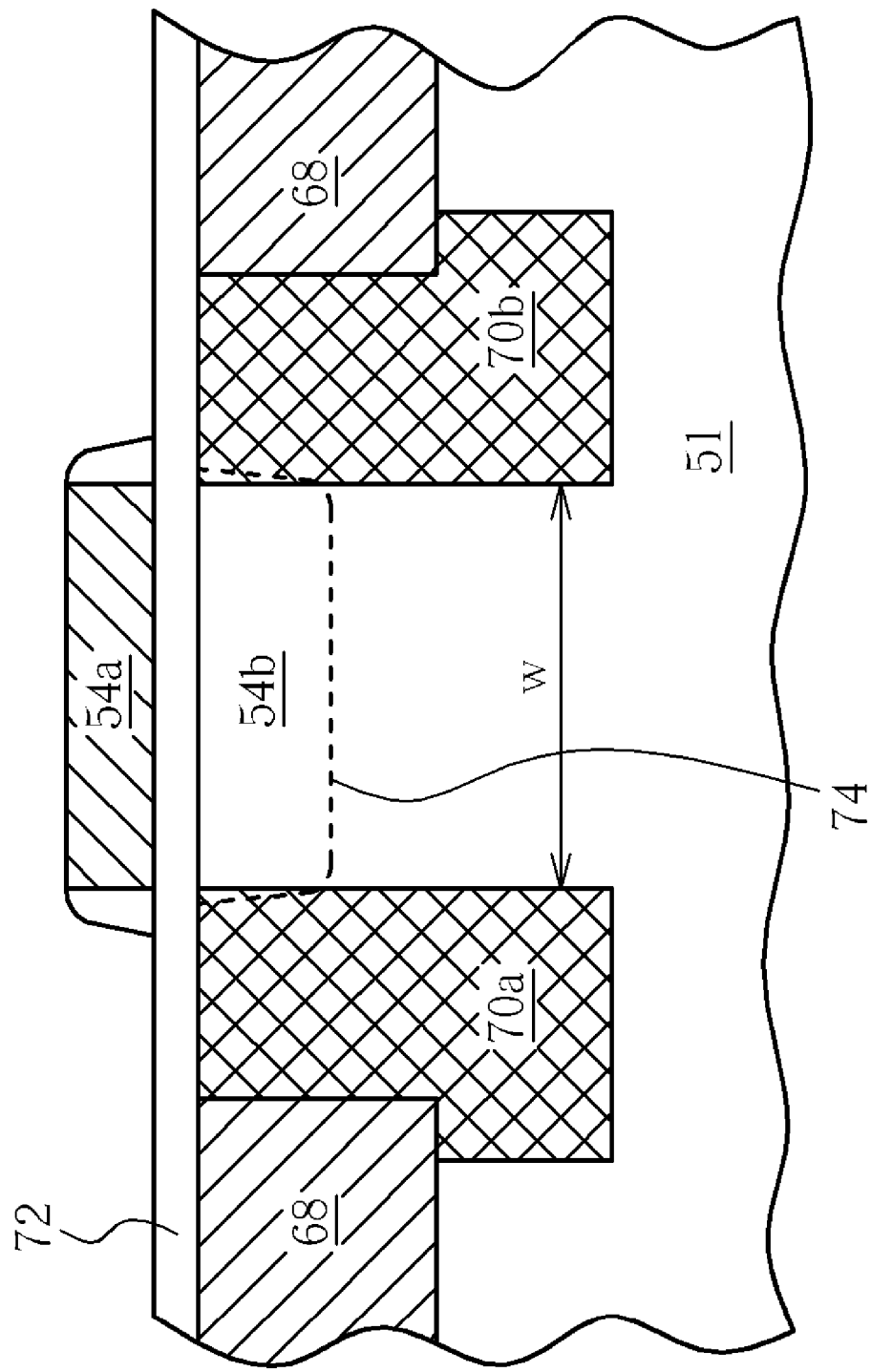
FIG. 6 is a section view along line A-A' of the dotted circle shown in FIG. 5.

It should be noted that the guard ring 70 encompassing the photodiode 52 has a gap 71, wherein a first guard ring end 70a and a second guard ring end 70b are positioned at two sides of the gap 71. The gate 54a is positioned on the silicon substrate in the gap 71 and next to the first guard ring end 70a and the second guard ring end 70b, without overlapping the guard ring 70. In addition, the gate 54a does not cover or overlap the isolation interface in a direction from the second guard ring end 70b to the first guard ring end 70a. When the reset transistor 54 is turned on, a chemical channel is occurred in the silicon substrate underneath the gate 54a, and the width W of the chemical channel is determined by the size of the gap 71 of the guard ring 70, which is the spacing of the first guard ring end 70a and the second guard ring end 70b. Please refer to FIG. 6. FIG. 6 is a section view along line A-A' of the dotted circle shown in FIG. 5. The gate 54a is disposed on a gate oxide layer 72. The first guard ring end 70a and the second guard ring end 70b are disposed in the silicon substrate 51 near the gate 54a. The chemical channel 54b is active when the gate 54a is conducting, and the active region underneath the gate 54a will become a depletion region 74. Since the guard ring 70 is positioned between the isolation region 68 and the gate 54a, the depletion region 74 does not directly contact the isolation region 68, 50 that the active region does not generate leakage current resulting from the isolation region 68 to influence the S/N ratio.

In addition, the length L of the chemical channel 54b of the reset transistor 54 is determined by the distance between the source and drain of the reset transistor 54. which means the length L of the chemical channel 54b is determined by the spacing between the N+ doped region 60 of the photodiode 52 and the N+ doped region 60 of the common drain. In a preferable embodiment of the present invention, the common drain of the reset transistor 54 and the source-follower transistor 56 further comprises a lightly doped drain (LDD) 59, and both of the first and second guard ring ends 70a, 70b extend to the LDD 59. Therefore, the length L of the chemical channel 54b of the reset transistor 54 is determined by the spacing between the LDD 59 and the photo sensor region of the photodiode 52. Furthermore, the width of the first guard ring end 70a is approximately the same as the spacing between the common drain, the N+ doped region 60 and the N+ doped region 60 of the photodiode 52 so as to separate the gate 54a and the isolation region 68.

In another embodiment of the present invention, the photodiode is selectively disposed in an N-well or an N-substrate. Consequently, the photo sensor region of the photodiode, and the sources and the drains of the transistors are formed with P+ doped regions, while the guard ring is a junction N-guard ring.

In contrast to the prior art, the present invention comprises a reset transistor with a gate positioned in a gap of the guard ring and next to the guard ring without overlapping the ring guard ring. In addition, the guard ring is positioned at the isolation interface of the isolation region and the silicon substrate. Therefore, the gate of the reset transistor does not directly contact the isolation region, so that the chemical channel and depletion region formed under the gate are completely isolated by the guard ring and seldom generate leakage current. Accordingly, the photodiode does not count extra dark current from the depletion region under the gate of the reset transistor and can observe a more correct S/N ratio to improve the accuracy of performance of the APS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An active pixel sensor cell (APS cell), the APS cell comprising:
   an isolation region positioned in a semiconductor substrate and surrounding the APS cell to isolate the APS cell, the isolation region having an isolation interface with other elements of the APS cell;
   a photodiode positioned in the semiconductor substrate, the photodiode comprising a first doped region;
   a guard ring comprising a first guard ring end and a second guard ring end surrounding the first doped region and having a gap, the guard ring being positioned at the isolation interface surrounding the first doped region;
   a first transistor comprising a first gate electrically connected to the first doped region with a conductive structure; and
   a second transistor comprising a common drain with the first transistor, a source electrically connected to the first doped region, and a second gate positioned on the semiconductor substrate above the gap, the common drain further comprises a lightly doped drain (LDD), wherein when the second transistor is turned on, a chemical channel is occurred in the semiconductor substrate underneath the second gate;
   wherein the second gate does not cover the isolation interface that is positioned between the conductive structure and the second gate, the length of the chemical channel is determined by the spacing between the first doped region and the LDD, and the first guard ring end and the second guard ring end extend to the LDD region.

2. The APS cell of claim 1, wherein a spacing between the first guard ring end and the second guard ring end is the width of the gap.

3. The APS cell of claim 2, wherein a width of the first guard ring end is approximately the same as a spacing between the common drain and the first doped region so as to separate the gate and the isolation region.

4. The APS cell of claim 1, wherein the guard ring is a junction guard ring.

5. The APS cell of claim 1, wherein the common drain is a second doped region.

6. The APS cell of claim 5, wherein the first and the second doped regions are N+ doped regions, and the guard ring is a junction P type doped region.

7. The APS cell of claim 5, wherein the first and the second doped regions are P+ doped regions, and the guard ring is a junction N doped region.

8. The APS cell of claim 1, wherein the first transistor is a current source follower, and the second transistor is a reset element.

9. The APS cell of claim 1, wherein the APS cell further comprises a third transistor serving as a row selector.

10. The APS cell of claim 1, wherein the isolation region is a shallow trench isolation (STI) or a field oxide layer (FOX).

11. An APS cell, comprising:
    an isolation region positioned in a semiconductor substrate and surrounding the APS cell to isolate the APS cell, the isolation region having an isolation interface with other elements of the APS cell;
    a photodiode positioned in the semiconductor substrate, the photodiode comprising a first doped region;
    a guard ring surrounding the first doped region and having a gap, the guard ring being positioned at the isolation interface surrounding the first doped region;
    a first transistor comprising a first gate electrically connected to the first doped region with a conductive structure; and
    a second transistor comprising a common drain with the first transistor, a source electrically connected to the first doped region, and a second gate positioned on the semiconductor substrate above the gap, the second gate not overlapping the guard ring;
    wherein the second gate does not cover the isolation interface that is positioned between the conductive structure and the second gate.

12. The APS cell of claim 11, wherein when the second transistor is turned on, a chemical channel is occurred in the semiconductor substrate underneath the second gate.

13. The APS cell of claim 12, wherein the length of the chemical channel is determined by a spacing between the first doped region and the common drain.

14. The APS cell of claim 12, wherein the common drain further comprises a LDD, and the length of the chemical channel is determined by the spacing between the first doped region and the LDD.

15. The APS cell of claim 11, wherein the guard ring comprises a first guard ring end and a second guard ring end, and a spacing between the first guard ring end and the second guard ring end is the width of the gap.

16. The APS cell of claim 15, wherein a width of the first guard ring end is approximately the same as a spacing between the common drain and the first doped region so as to separate the gate and the isolation region.

17. The APS cell of claim 11, wherein the guard ring is a junction guard ring.

18. The APS cell of claim 11, wherein the common drain is a second doped region.

19. The APS cell of claim 18, wherein the first and the second doped regions are N+ doped regions, and the guard ring is a junction P type doped region.

20. The APS cell of claim 18, wherein the first and the second doped regions are P+ doped regions, and the guard ring is a junction N doped region.

21. The APS cell of claim 11, wherein the first transistor is a current source follower, and the second transistor is a reset element.

22. The APS cell of claim 11, wherein the APS cell further comprises a third transistor serving as a row selector.

23. The APS cell of claim 11, wherein the isolation region is a shallow trench isolation or a field oxide layer.

* * * * *